(12) United States Patent
Walsh

(10) Patent No.: US 6,351,327 B1
(45) Date of Patent: Feb. 26, 2002

(54) LIQUID CRYSTAL PIXEL CURRENT SENSING FOR SILICON MICRO DISPLAYS

(75) Inventor: Hugh M Walsh, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 29 days.

(21) Appl. No.: 09/584,910

(22) Filed: May 30, 2000

(51) Int. Cl.⁷ .................................................. G02F 1/03
(52) U.S. Cl. ...................... 359/259; 359/248; 359/254; 359/291; 359/295; 359/634; 345/97; 345/87; 349/18; 349/171
(58) Field of Search .............................. 359/245, 248, 359/254, 259, 291, 295, 633, 634, 639; 345/87, 97, 99; 349/18, 171, 172

(56) References Cited

U.S. PATENT DOCUMENTS

| | | | |
|---|---|---|---|
| 5,596,451 A | | 1/1997 | Handschy et al. ........... 359/633 |
| 6,108,119 A | * | 8/2000 | Devenport et al. ......... 359/248 |
| 6,163,360 A | * | 12/2000 | Tanaka et al. .............. 349/172 |
| 6,191,883 B1 | * | 2/2001 | Huffman et al. ............ 359/291 |
| 6,198,523 B1 | * | 3/2001 | Helbing ....................... 349/171 |
| 6,243,065 B1 | * | 6/2001 | Robrish et al. ............... 345/97 |
| 6,249,269 B1 | * | 6/2001 | Blalock et al. ............... 345/97 |
| 6,271,820 B1 | * | 8/2001 | Bock et al. ................... 345/97 |
| 6,278,426 B1 | * | 8/2001 | Akiyama ..................... 345/87 |

FOREIGN PATENT DOCUMENTS

EP        0953959        12/1998    ............ G09G/3/34

* cited by examiner

Primary Examiner—Loha Ben

(57) ABSTRACT

A liquid crystal pixel current sensing technique is described that increases LC (Liquid Crystal)-based micro display contrast fidelity and lowers production costs. A spatial light modulator has an electro-optical material (such as a liquid crystal layer) between an array of pixel electrodes and a common electrode (such as an indium tin oxide (ITO) layer). An amplifier biases the common electrode of the spatial light modulator and outputs a differential current proportional to the electro-optical material current. The output is used to determine delay of a light source to compensate for switching delay of the modulator. For one embodiment, the amplifier has a common-source push-pull output stage and current mirrors. For another embodiment, the output stage is a cascode common-source push-pull output stage. Because the current sensor does not perform current-to-voltage conversion, it does not alter the impedance between the pixel driver and the pixel electrode. Also, it can be used to measure the current through the entire active display area. Furthermore, this liquid crystal current-sensing circuit is a simple addition to the circuit that drives the ITO electrode with a DC bias voltage. Moreover, this addition is very simple to design and requires very little extra area.

18 Claims, 7 Drawing Sheets

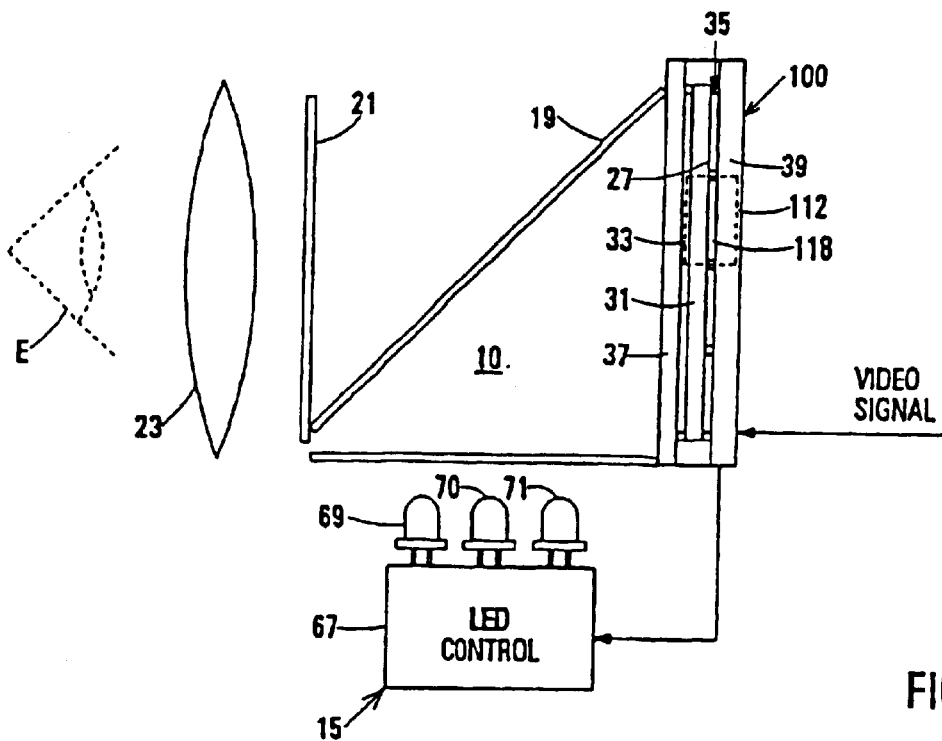
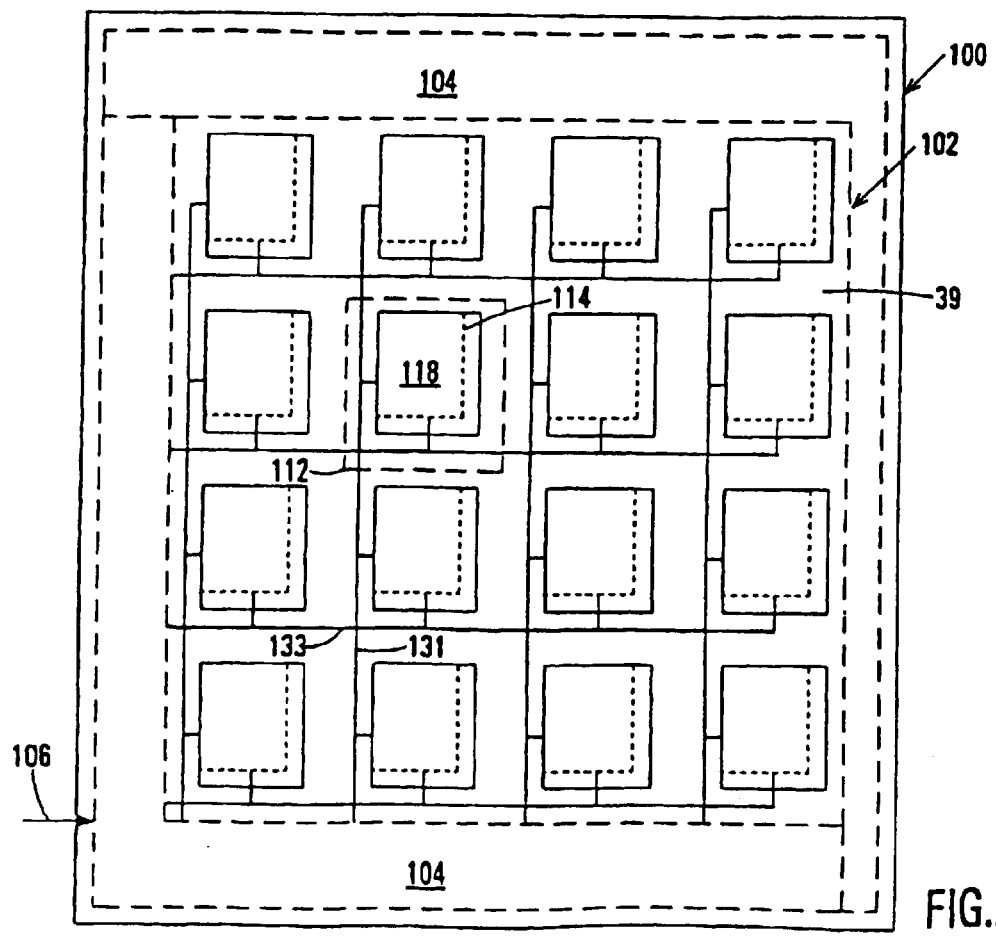
FIG.1
FIG.2A

LIQUID CRYSTAL PIXEL CURRENT SENSING FOR SILICON MICRO DISPLAYS

BACKGROUND OF THE INVENTION

1. Field of the Invention

The present invention relates to liquid crystal-based video and graphics display devices, and, in particular, to sensing liquid crystal pixel current for such display devices.

2. Description of the Related Art

A substantial need exists for various types of video and graphics display devices with improved performance and lower cost. For example, a need exists for miniature video and graphics display devices that are small enough to be integrated into a helmet or a pair of glasses so that they can be worn by the user. Such wearable display devices would replace or supplement the conventional displays of computers and other devices. In particular, wearable display devices could be used instead of the conventional displays of laptop and other portable computers. Potentially, wearable display devices can provide greater brightness, better resolution, larger apparent size, greater privacy, substantially less power consumption and longer battery life than conventional active matrix or double-scan liquid crystal-based displays. Other potential applications of wearable display devices are in personal video monitors, in video games and in virtual reality systems.

Miniaturized displays based on cathode-ray tubes or conventional liquid crystal displays have not been successful in meeting the demands of wearable displays for low weight and small size. Of greater promise is a micro display of the type described in U.S. Pat. No. 5,596,451 of Handschy et al. (digital pixel driver) and in European patent application no. 98122934.7 of Walker et al. (analog pixel driver), the disclosures of which are incorporated into this disclosure by reference. This type of micro display includes a reflective spatial light modulator that uses a liquid crystal (LC) material as its light control element. Typically, a ferroelectric liquid crystal (FLC) material is used as the light control element.

There is a need for a circuit that accurately senses liquid crystal pixel current. This is because the set voltage of the pixel electrode determines the reflectivity of the pixel. However, there is a time delay between the setting voltage and the optical reflection. If one does not compensate for the delay, the display will lose some contrast because the light source will turn on immediately even though the pixel does not. Sensing the liquid crystal pixel current provides a way to measure the time delay and thereby turn on the light (e.g., LED) to achieve best contrast (because the LC switches as the light is turned on).

One typical prior art approach to measure pixel current is to insert a resistor to detect current through current-to-voltage conversion. Using this approach one can sense the current through the liquid crystal with a resistive element connected between the pixel driver and the pixel electrode. The current is thus converted to a differential voltage. This is shown in FIG. 7. Unfortunately, the added resistive element changes the impedance between the pixel driver and the pixel electrode. This degrades the resulting image. Furthermore, linear resistors are not readily available in standard digital CMOS process. The use of nonlinear resistors can create significant nonlinear distortion when converting a current to a voltage.

Another typical prior art approach to measure pixel current is to use restricted areas for sensing the liquid crystal current. Using this technique, one attempts to sense the current through the liquid crystal in areas outside the pixel array. However, the current through the liquid crystal in these regions may not match the current through the liquid crystal material covering the pixel array.

Thus, it can be seen that modern liquid crystal pixel current sensing techniques impose contrast fidelity and production cost limits upon LC-based micro displays, and hinder the use of these micro displays in many applications.

Therefore, there is an unresolved need for an improved liquid crystal pixel current sensing technique that can increase LC-based micro display contrast fidelity and lower production costs.

SUMMARY OF THE INVENTION

A liquid crystal pixel current sensing technique is described that increases LC (Liquid Crystal)-based micro display contrast fidelity and lowers production costs.

A spatial light modulator has an electro-optical material (such as a liquid crystal layer) between an array of pixel electrodes and a common electrode (such as an indium tin oxide (ITO) layer). An amplifier biases the common electrode of the spatial light modulator and outputs a differential current proportional to the electro-optical material current. The output is used to determine delay of a light source to compensate for switching delay of the modulator.

For one embodiment, the amplifier has a common-source push-pull output stage and current mirrors. For another embodiment, the output stage is a cascode common-source push-pull output stage.

There are several advantages of this liquid crystal pixel current sensor. Because it does not perform current-to-voltage conversion, it does not alter the impedance between the pixel driver and the pixel electrode.

Also, it can be used to measure the current through the entire active display area.

Furthermore, this liquid crystal current-sensing circuit is a simple addition to the circuit that drives the ITO electrode with a DC bias voltage.

Moreover, this addition is very simple to design and requires very little extra area.

BRIEF DESCRIPTION OF THE DRAWINGS

The invention will be readily understood by the following detailed description in conjunction with the accompanying drawings, wherein like reference numerals designate like structural elements, and in which:

FIG. 1 shows the structure of a display device that incorporates the pixel current sensing circuitry according to the invention;

FIGS. 2A–2D show details of the spatial light modulator of the display device shown in FIG. 1;

DETAILED DESCRIPTION OF THE INVENTION

Figure 2B:
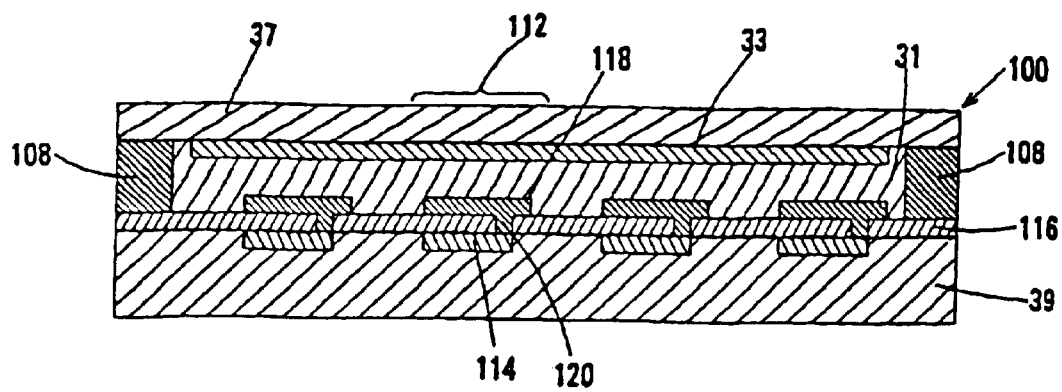

Embodiments of the invention are discussed below with reference to FIGS. 1–6. Those skilled in the art will readily appreciate that the detailed description given herein with respect to these figures is for explanatory purposes, however, because the invention extends beyond these limited embodiments.

FIG. 1 shows the structure of the display device 10 according to the invention that includes the reflective spatial light modulator 100. Other principal components of the display device are the light source 15, the polarizer 17, the beam splitter 19, the analyzer 21 and the eyepiece 23.

The light source 15 is composed of the LED driver 67 that drives the LEDs 69–71. The LEDs are of different colors and are independently driven in a color display device. Fewer or more LEDs, or other light-emitting devices whose output can be rapidly modulated may alternatively be used as the light source 15. As a further alternative, a white light source and a light modulator may be used. The light modulator modulates the amplitude of the light output by the light source and, in a color display device, additionally modulates the color of the light output.

The light source 15 generates light that passes through the polarizer 17. The beam splitter 19 reflects a fraction of the polarized light from the polarizer towards the spatial light modulator 100. The reflective electrode 35 located on the surface of the substrate 39 of the spatial light modulator reflects a fraction of the incident polarized light. Depending on the electric field across the layer 31 of electro-optical material (the electro-optical layer), to be described below, the direction of polarization of the reflected light is either unchanged or is rotated through 90 DEG . The reflected light passes to the user's eye E through the beam splitter 19, the analyzer 21 and the eyepiece 23.

The eyepiece 23 focuses the light reflected by the reflective electrode 35 at the user's eye E. The eyepiece is shown as a single convex lens in FIG. 1. A more complex optical arrangement may be used to form a low-aberration image of the desired apparent size at the user's eye.

The direction of polarization of the analyzer 21 is aligned parallel to the direction of polarization of the polarizer 17 so that light whose direction of polarization has not been rotated by the spatial light modulator will pass through the analyzer to the user's eye E, and light whose direction of polarization has been rotated through 90 DEG by the spatial light modulator will not pass through the analyzer. Thus, the analyzer prevents light whose direction of polarization has been rotated by the spatial light modulator from reaching the user's eye. Consequently, the spatial light modulator will appear light or dark to the user depending on the applied electric field. When the spatial light modulator appears light, it will be said to be in its ON state, and when the spatial light modulator appears dark, it will be said to be in its OFF state. The direction of polarization of the analyzer can alternatively be arranged orthogonal to that of the polarizer. In this case, the spatial light modulator operates in the opposite sense to that just described. This enables a positive picture to be obtained by illuminating the spatial light modulator during the balance period, to be described below.

The optical arrangement shown in FIG. 1 may also form the basis of a full-size video or graphics display. Such a full-size color display device, (e.g., having a nominal diagonal dimension of 430 mm) can be made by increasing the intensity of the light source 15 and by replacing the eyepiece 23 with magnifying optics that form an image of the reflective electrode 35 on a suitable screen. A single spatial light modulator sequentially illuminated by light of the three primary colors, or parallel spatial light modulators, each illuminated by light of a different primary color, can be used in a full-size color display device.

FIG. 1 additionally shows some details of the spatial light modulator 100. The spatial light modulator is composed of the electro-optical layer 31 sandwiched between the common electrode 33 and the reflective electrode 35. The electrode 33 is transparent and is deposited on the surface of the transparent cover 37. The electrode 35 is located on the surface of the semiconductor substrate 39. As will be discussed below primarily in connection with FIGS. 3–6, the present invention provides pixel current sensing for electro-optical layer 31.

An electro-optical material is a material having an optical property that depends on an applied electric field. For example, in the optical arrangement shown in FIG. 1, the rotation of the direction of polarization of light impinging on the electro-optical layer depends on the direction of an electric field applied to the layer. In other electro-optical materials, rotation of the direction of polarization may depend on the strength of the electric field applied to the layer. The transmissivity of other electro-optical materials may depend on the electric field applied to the layer.

In the preferred embodiment, the electro-optical material is a ferroelectric liquid crystal material. The direction of the electric field applied between the transparent electrode 33 and the reflective electrode 35 determines whether the direction of polarization of light impinging on the ferroelectric material sandwiched between the electrodes is rotated or not. In other embodiments, a conventional nematic liquid crystal may be used as the electro-optical material. In this case, the strength of the electric field between the electrodes determines whether the direction of polarization is rotated or not.

To enable the display device 10 to display an image instead of merely controlling the passage of light from the light source 15 to the user's eye E, the reflective electrode 35 is divided into a two-dimensional array of pixel electrodes, exemplary ones of which are shown at 118. In addition, a drive circuit (114 in FIG. 2A) that drives the pixel electrode is located in the substrate 39 under each pixel electrode. The drive circuit, the pixel electrode and the portions of the electro-optical layer 31 and the common electrode 33 overlaying the pixel electrode collectively constitute a pixel, an exemplary one of which is shown at 112.

When the electro-optical layer 31 is composed of a ferroelectric material, the direction of the electric field applied between each pixel electrode, such as the pixel electrode 118, and the common electrode 33 determines whether the direction of polarization of the light reflected by the pixel electrode is rotated through 90 DEG or not, and thus whether the corresponding pixel, such as the pixel 112, will appear bright or dark to the user. When the pixel appears light, the pixel will be said to be in its ON state, and when the pixel appears dark, the pixel will said to be in its OFF state.

The optical characteristics of the pixels of the spatial light modulator 100 may be binary: light from the light source 15 and reflected by the pixel either passes through the analyzer 21 to the user's eye E or does not pass through the analyzer to the user's eye. To produce a grey scale, the apparent brightness of each pixel is varied by temporally modulating the light that reaches the user's eye. The light is modulated by choosing a basic time period that will be called the illumination period of the spatial light modulator. The spatial light modulator is illuminated through the illumination period, and each pixel is set to its ON state for a first temporal portion of the illumination period, and to its OFF state for a second temporal portion. The second temporal portion constitutes the remainder of the illumination period, and is thus complementary to the first temporal portion. Alternatively, the OFF state may precede the ON state. The fraction of the illumination period constituted by the first temporal portion, during which the pixel is in its ON state, determines the apparent brightness of the pixel.

Alternatively, this invention may also be used when non-binary modulators (as are often found with nematic LC) are used.

The principles just described may be extended to enable the spatial light modulator to generate a color image. In this case, the spatial light modulator is driven by the color components of a color video signal, and three display periods are defined for each frame of the color video signal, one for each color component. The light source 15 illuminates the spatial light modulator with light of a different color during the illumination period of each display period. Each pixel is set to its ON state for a fraction of each of the three illumination periods, and to its OFF state for the remainder of the illumination period. The fraction of each of the three illumination periods in which the pixel is in its ON state determines the apparent saturation and hue of the pixel. The display periods of a color display may each correspond to one-third of the frame period of the color video signal, for example. Making the display period the same for the three color components is operationally convenient, but is not essential.

The spatial light modulator 100 will now be described in more detail with reference to FIGS. 2A–2D. Referring first to FIGS. 2A and 2B, the light modulator is composed of the electro-optical layer 31 sandwiched between the transparent cover 37 and the semiconductor substrate 39. The transparent cover, which may be a thin glass plate, for example, is separated from the substrate by the spacers 108. The translucent common electrode 33, which may be a layer of indium tin oxide (ITO), for example, is located on the inside surface of the transparent cover, facing the substrate.

An array 102 of pixels is located on the surface of the substrate 39. The exemplary pixel is shown at 112. The drawings throughout this disclosure show pixel arrays with only four pixels in each dimension to simplify the drawings. In a practical embodiment, the pixel array would be composed of, for example, 640×480, 800×600 pixels, 1280× 1024 pixels, 2044×1125 pixels, or some other acceptable two-dimensional arrangement of pixels.

For each pixel in the pixel array 102, a drive circuit is formed by conventional semiconductor processing on and under the surface of the substrate 39. The analog drive circuit of the exemplary pixel 112 is shown at 114. The analog drive circuit is composed of transistors, capacitors and other circuit elements (not shown) interconnected by one or more layers of conductors (not shown). The analog drive circuits of the pixels constituting the pixel array 102 are connected to one another and to pads through which external electrical connections are made by additional layers of conductors (not shown). The surface of the substrate, and the above-mentioned layers of conductors, are covered by the insulating layer 116. The reflective pixel electrode 118 of the pixel 112 is located on the surface of the insulating layer overlaying the analog drive circuit. The pixel electrode is connected to the output of the analog drive circuit 114 by the conductor 120 which passes through an aperture formed in the insulating layer.

In the pixel 112, the analog drive circuit 114 generates a drive signal that is applied to the pixel electrode 118. The drive signal applied to the electrode has a 1 state and a 0 state. The 1 state may be a high voltage state, and the 0 state may be a low voltage state, for example. The state of the drive signal applied to the pixel electrode determines whether or not the portion of the electro-optical layer 31 overlaying the pixel electrode rotates the direction of polarization of light falling on the pixel, as described above. The analog drive circuit sets the apparent brightness of the pixel by applying the drive signal to the pixel electrode in response to an analog sample derived from a video signal. During each above-described illumination period the drive signal starts in one state, corresponding to the ON state of the pixel, for example, and remains there for the first temporal portion. Before the end of the illumination period, the drive signal switches to the other state and remains there for the second temporal portion. The fraction of the illumination period for which the pixel is in its ON state determines the apparent brightness of the pixel. When the video signal is a color video signal, the analog drive circuit sets the apparent saturation and hue of the pixel by applying drive signals that turn the pixel ON for fractions of three consecutive illumination periods that depend on the three color components of the color video signal.

FIG. 2A shows the pixels arranged in the two-dimensional pixel array 102 on the surface of the substrate 39. The sample derivation and distribution circuit 104 is also formed in the substrate 39. This circuit distributes samples derived from the video signal received via the video input 106 to the pixel array and generates the various timing and control signals required by the pixel array. Signals are distributed from the sample derivation and distribution circuit to the pixels by busses, representative ones of which are shown schematically at 131 and 133.

Figure 2C:
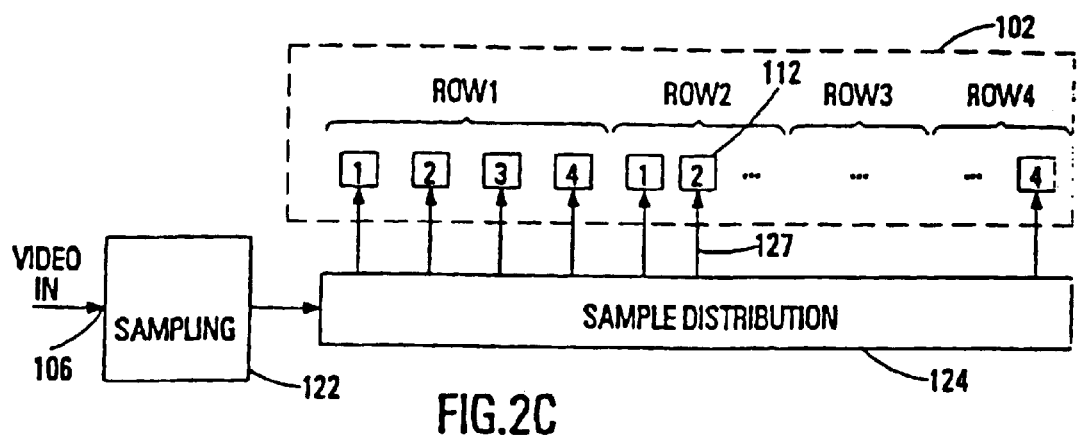

FIG. 2C is schematic representation of the electrical arrangement of the spatial light modulator 100. The sampling circuit 122 receives a video signal via the video input 106 and derives a stream of samples from the video signal. The samples are distributed to the pixels constituting the pixel array 102 by the sample distribution circuit 124. Each pixel receives at least one sample of each frame of the video signal. The location in the frame of the video signal whence the sample is derived corresponds to the location of the pixel in the pixel array.

Figure 2D:
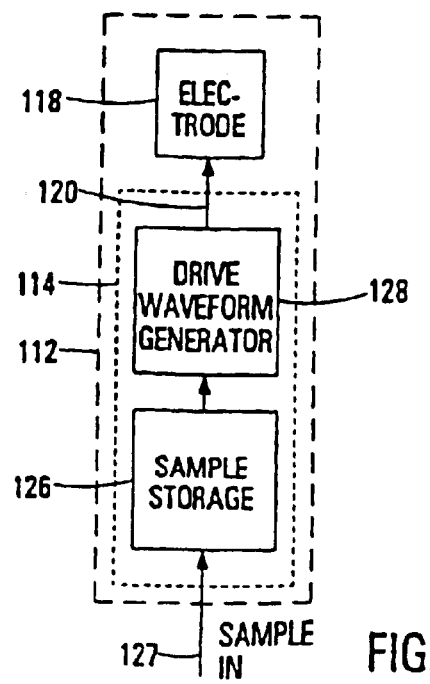

FIG. 2D is a schematic representation of the electrical arrangement of the pixel 112 in the two-dimensional pixel array 102. The remaining pixels have the same electrical arrangement. The pixel is composed of the drive circuit 114, the output of which is connected to the electrode 118 by the conductor 120. The drive circuit is composed of the sample selection section 126, and the drive signal generator 128. The sample selection section has a sample input 127 connected to the sample distribution circuit 124 (FIG. 2C). During each frame of the video signal, the sample selection section receives a sample derived from the video signal via the sample input and temporarily stores the sample until the sample is needed by the drive signal generator 128.

The drive signal generator 128 receives each sample stored in the sample selection section 126 during the picture period of the previous frame and, in response to the sample, generates a drive signal and applies the drive signal to the electrode 118. The drive signal generator generates the drive signal with a period corresponding to the above-described display period.

The display period of each frame begins immediately after the end of the display period of the previous frame. In some embodiments, the drive waveform is generated intermittently, and a period in which the drive signal is generated in a neutral state is interposed between consecutive display periods.

The waveforms just described are those required to drive a electro-optical material that lacks a bistable characteristics. However, it will be apparent to a person of ordinary skill in the art that circuits for generating such waveforms can easily be adapted to generate the waveforms required to drive a bistable electro-optical material. For example, a drive circuit capable of generating the waveforms just described can be adapted to drive a bistable electro-optical material by capacitatively or a.c. coupling the output of the circuit to the pixel electrode.

Figure 3:
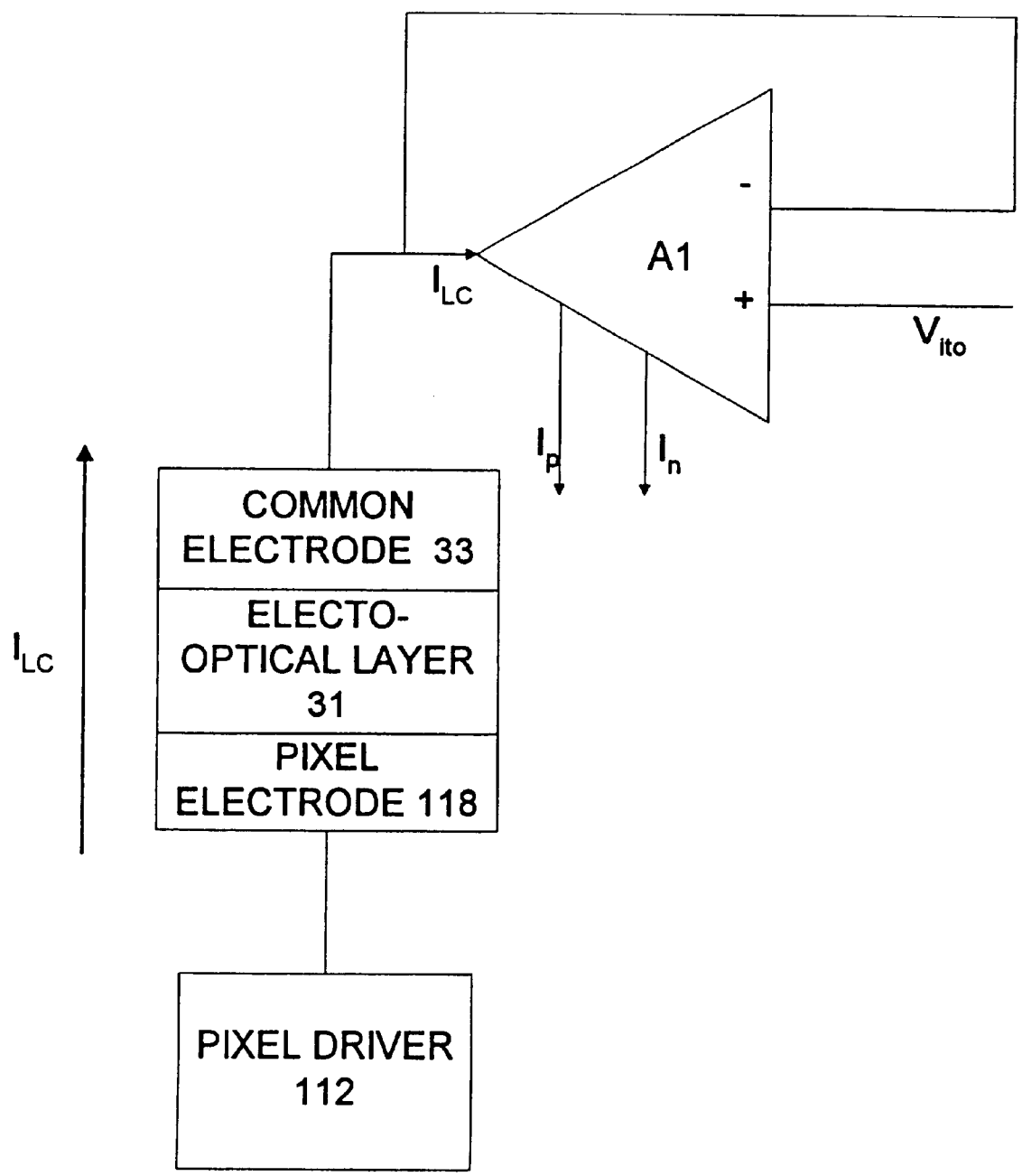
FIG. 3 is a diagram illustrating a liquid crystal pixel current sensor for a liquid crystal display according to the present invention.

FIG. 3 is a diagram illustrating a liquid crystal pixel current sensor for a liquid crystal display according to the present invention. FIG. 3 shows the pixel drive circuit 112, the pixel electrode 118, the electro-optical layer 31 (e.g., liquid crystal), common electrode 33 (e.g., the ITO layer), and amplifier A1. Amplifier A1 drives the ITO layer with a DC bias voltage "$V_{ito}$" and senses the current through the liquid crystal.

When the pixel drive circuit 112 switches between the "on" and "off" states, current $I_{LC}$ flows through the liquid crystal 31. For this description, $I_{LC}$ flowing from the pixel electrode 118 to the ITO layer 33 is defined to be positive.

Figure 4:
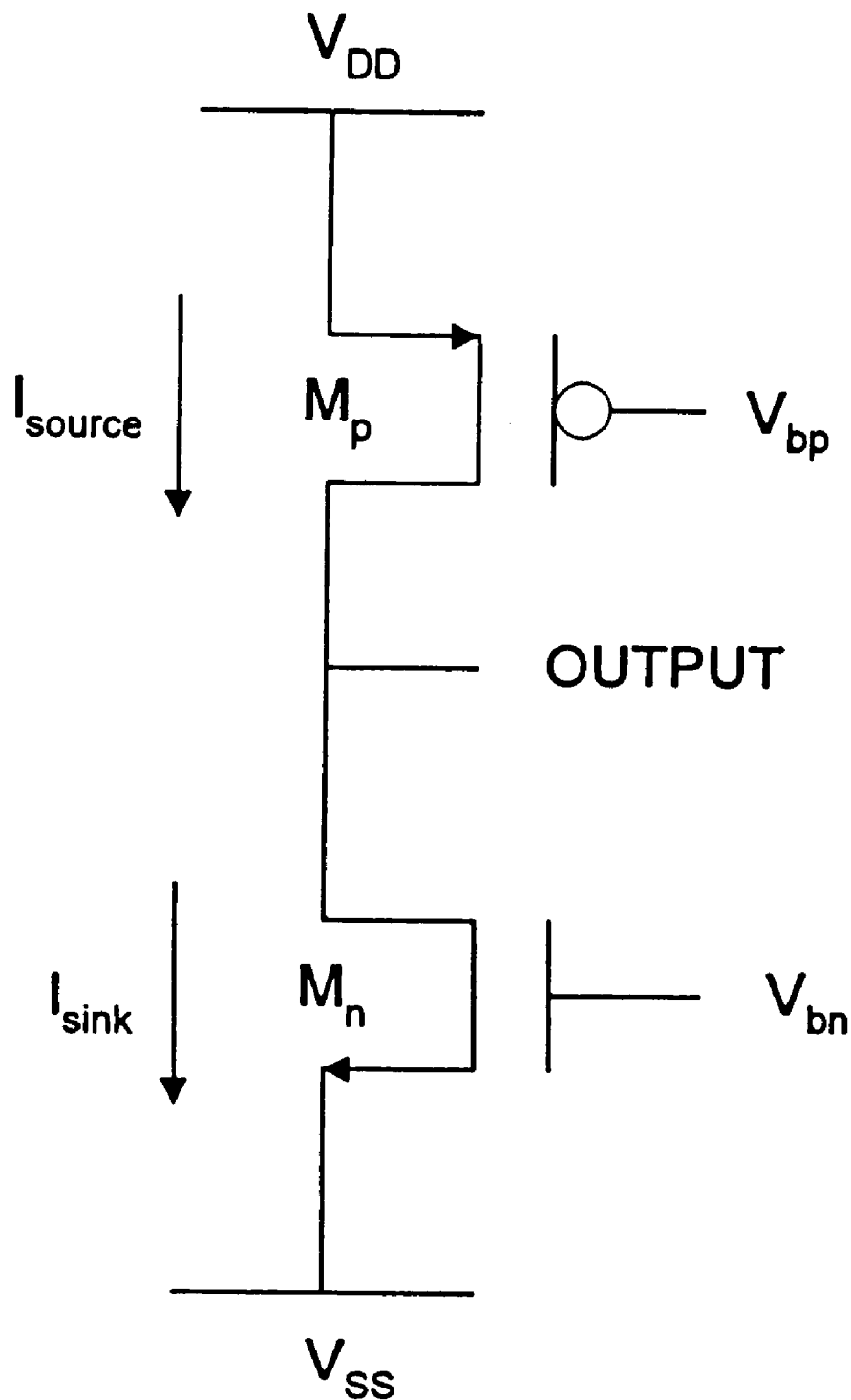
FIG. 4 is a diagram illustrating a simple output stage according to the present invention.

FIG. 4 shows a simple common-source push-pull output stage suitable for use in the amplifier A1 of FIG. 3. The output stage of A1 either sources or sinks $I_{LC}$. Current $I_{source}$ flows through transistor $M_p$ from the positive power supply ($V_{DD}$) to the OUTPUT. Current $I_{sink}$ flows through transistor $M_n$ from the OUTPUT to the negative power supply (VSS). Transistors $M_p$ and $M_n$ have respective bias voltages $V_{bp}$ and $V_{bn}$.

Figure 5:
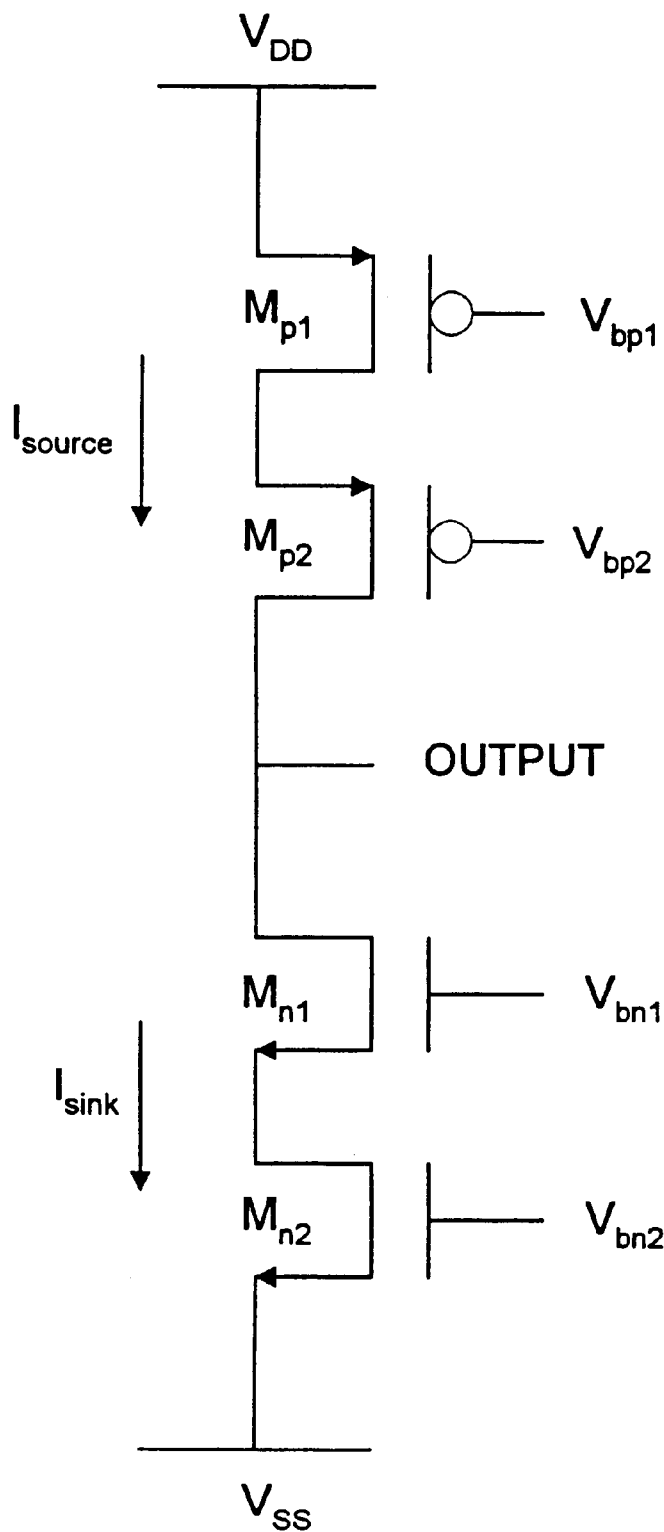
FIG. 5 is a diagram illustrating a cascode output stage according to an embodiment of the present invention.

It will be understood by one skilled in the art that other output stage variations for Amplifier A1 are possible. For example, FIG. 5 shows a cascode common-source push-pull output stage for use in the amplifier A1 of FIG. 3. Again, the output stage of A1 either sources or sinks $I_{LC}$. Current $I_{source}$ flows through transistors $M_{p1}$ and $M_{p2}$ from the positive power supply ($V_{DD}$) to the OUTPUT. Current $I_{sink}$ flows through transistors $M_{n1}$ and $M_{n2}$ from the OUTPUT to the negative power supply (VSS). Transistors $M_{p1}$ and $M_{p2}$ have respective bias voltages $V_{bp1}$ and $V_{bp2}$. Similarly, transistors $M_{n1}$ and $M_{n2}$ have respective bias voltages $V_{bn1}$ and $V_{bn2}$.

Figure 6:
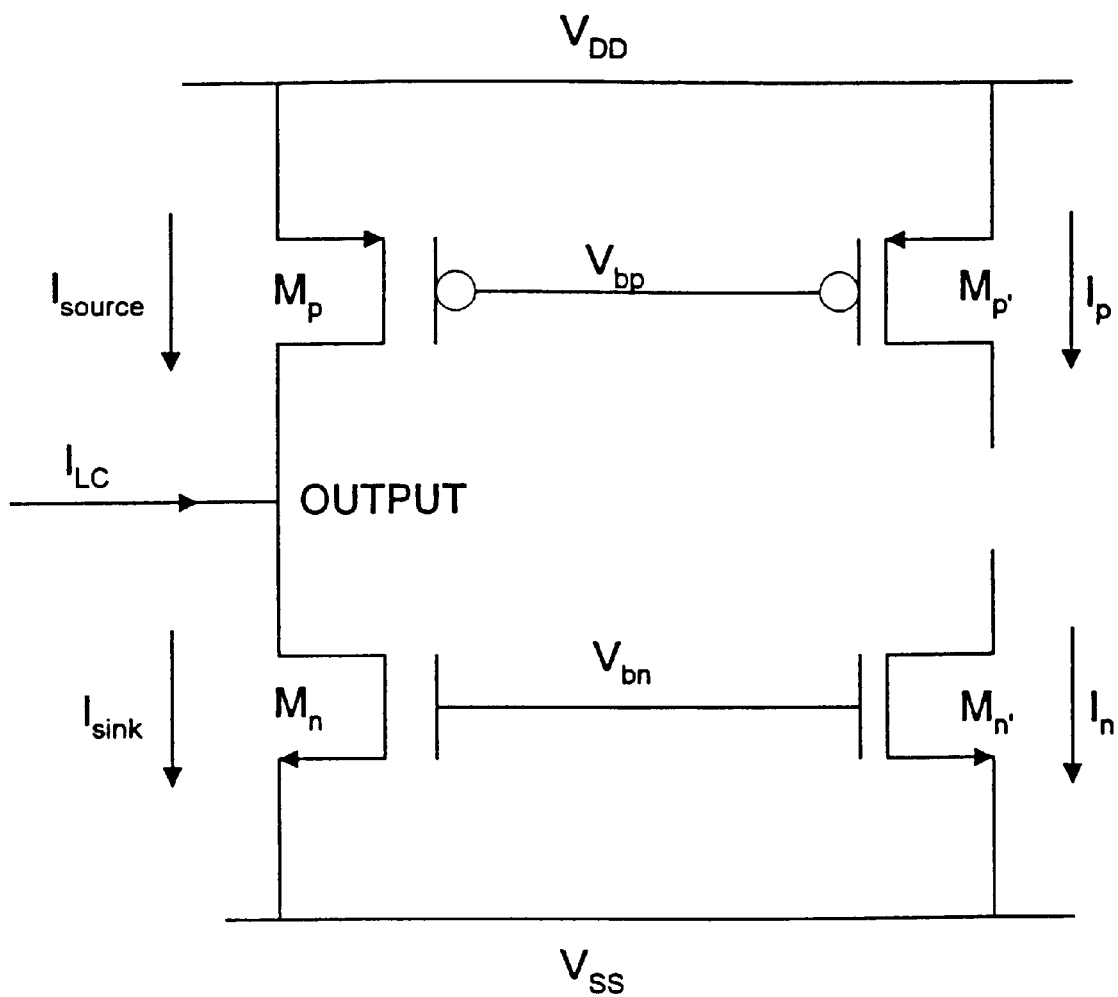
FIG. 6 illustrates an output stage with current sensing according to an embodiment of the present invention.
Figure 7:
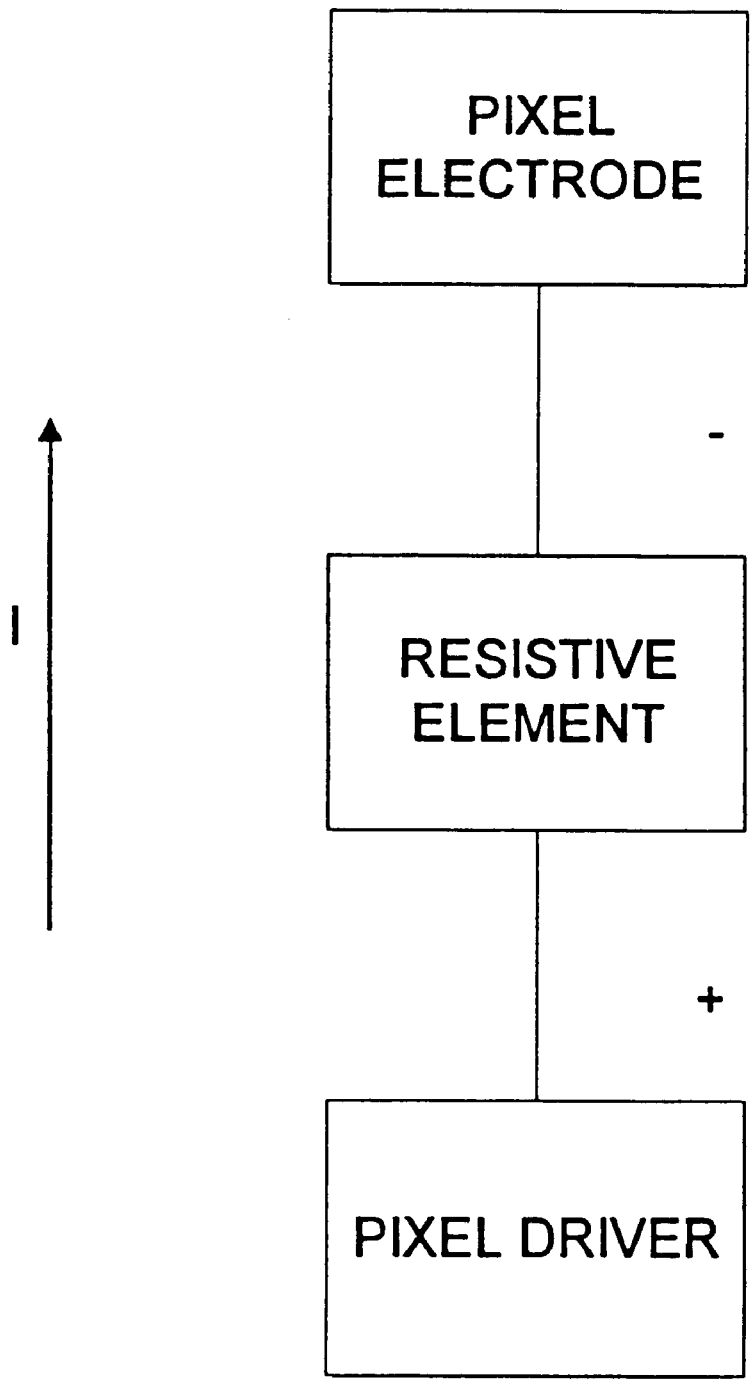
FIG. 7 illustrates a prior art current-to-voltage conversion technique for measurement of liquid crystal pixel current.

FIG. 6 shows the output stage and current mirrors for the simple common-source push-pull output stage of FIG. 4. A1 has current mirrors ($M_p$, and $M_n$,) connected to the output stage that replicate $I_{source}$ to output $I_p$, and $I_{sink}$ to output $I_n$, such that:

$$I_p = K \cdot I_{source} \quad [\text{Eq 1}]$$

$$I_n = K \cdot I_{sink} \quad [\text{Eq 2}]$$

where K is the current-mirror multiplication ratio. $I_{LC}$ can then be determined from the following equation:

$$I_{LC} = K \cdot (I_n - I_p) \quad [\text{Eq 3}]$$

By sensing liquid crystal pixel current of silicon micro displays in this way, one can avoid problems caused by prior liquid crystal current sensing techniques. This liquid crystal pixel current sensor does not perform current-to-voltage conversion, so it does not alter the impedance between the pixel driver and the pixel electrode.

Also, this liquid crystal pixel current sensor can be used to measure the current through the entire active display area.

Furthermore, this liquid crystal current-sensing circuit is a simple addition to the circuit that drives the ITO electrode with a DC bias voltage.

Moreover, this addition is very simple to design and requires very little extra area.

The many features and advantages of the invention are apparent from the written description and thus it is intended by the appended claims to cover all such features and advantages of the invention. Further, because numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A spatial light modulator, comprising:
   a common electrode;
   an array of pixel electrodes;
   an electro-optical material between the common electrode and the array of pixel electrodes: and
   an amplifier to bias the common electrode and sense electro-optical material current using amplifier current.

2. The modulator as set forth in claim 1, wherein the amplifier comprises an output stage and current mirrors.

3. The modulator as set forth in claim 2, wherein the output stage is a common-source push-pull output stage.

4. The modulator as set forth in claim 2, wherein the output stage is a cascode common-source push-pull output stage.

5. The modulator as set forth in claim 1, wherein the electro-optical material is a liquid crystal layer.

6. The modulator as set forth in claim 1, wherein the common electrode is an ITO (indium tin oxide) layer.

7. The modulator as set forth in claim 1, wherein the amplifier outputs a differential current proportional to the electro-optical material current.

8. A display device having the modulator of claim 1.

9. The display device of claim 8 having a light source, wherein the sensed electro-optical material current is used to delay the light source to compensate for switching delay of the modulator.

10. A spatial light modulator method, comprising:
    biasing common electrode of a spatial light modulator using an amplifier, the modulator having an electro-optical material between the common electrode and an array of pixel electrodes; and
    sensing electro-optical material current using amplifier current.

11. The modulator method as set forth in claim 10, wherein the amplifier comprises an output stage and current mirrors.

12. The modulator method as set forth in claim 11, wherein the output stage is a common-source push-pull output stage.

13. The modulator method as set forth in claim 11, wherein the output stage is a cascode common-source push-pull output stage.

14. The modulator method as set forth in claim 10, wherein the electro-optical material is a liquid crystal layer.

15. The modulator method as set forth in claim 10, wherein the common electrode is an ITO (indium tin oxide) layer.

16. The modulator method as set forth in claim 10, wherein the amplifier outputs a differential current proportional to the electro-optical material current.

17. A display method having the modulator method of claim 10.

18. The display method of claim 17, wherein the sensed electro-optical material current is used to delay a light source to compensate for switching delay of the modulator.

* * * * *